(12) United States Patent
Hofmeister et al.

(10) Patent No.: US 10,328,580 B2
(45) Date of Patent: Jun. 25, 2019

(54) REDUCED FOOTPRINT SUBSTRATE TRANSPORT VACUUM PLATFORM

(71) Applicant: Persimmon Technologies, Corp., Wakefield, MA (US)

(72) Inventors: Christopher Hofmeister, Hampstead, NH (US); Martin Hosek, Lowell, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 677 days.

(21) Appl. No.: 14/454,926

(22) Filed: Aug. 8, 2014

(65) Prior Publication Data

US 2015/0044001 A1    Feb. 12, 2015

Related U.S. Application Data

(60) Provisional application No. 61/864,028, filed on Aug. 9, 2013.

(51) Int. Cl.
*B25J 18/00* (2006.01)
*B25J 11/00* (2006.01)
*H01L 21/67* (2006.01)

(52) U.S. Cl.
CPC ..... *B25J 11/0095* (2013.01); *H01L 21/67196* (2013.01); *H01L 21/67201* (2013.01)

(58) Field of Classification Search
CPC . B25J 11/0095; B25J 9/042; H01L 21/67196; H01L 21/67201; H01L 21/67742

(Continued)

(56) References Cited

U.S. PATENT DOCUMENTS 6,428,262 B1 *  8/2002  Vanderpot ......... H01L 21/67745
                                                  414/217
8,167,522 B2 *  5/2012  Duhamel .......... H01L 21/67276
                                                  414/217

(Continued)

OTHER PUBLICATIONS

"Robot and Adaptive Placement System and Method", Christopher Hofmeister, et al., U.S. Appl. No. 61/831,320, filed Jun. 5, 2013, 51 pgs.

*Primary Examiner* — Charles A Fox
*Assistant Examiner* — James Buckle, Jr.
(74) *Attorney, Agent, or Firm* — Harrington & Smith

(57) ABSTRACT

An apparatus has a vacuum transport chamber having first and second isolation valves coupled to first and second substrate processing locations, and third and fourth isolation valves coupled to a load lock. First and substrate transport vacuum robots are provided. The load lock is between the first and second substrate transport vacuum robots, and has an atmospheric isolation valve. The atmospheric isolation valve, the third and the fourth isolation valves are arranged in a spaced triangular relationship. The first substrate transport vacuum robot transports a processed substrate from the first processing location to the load lock and transports an unprocessed substrate from the load lock to the first processing location substantially simultaneously as the second substrate transport vacuum robot transports a different processed substrate from the second processing location to the load lock and transports a different unprocessed substrate from the load lock to the second processing location.

20 Claims, 10 Drawing Sheets

(58) Field of Classification Search
USPC .......................... 414/217, 744.2, 744.5, 935
See application file for complete search history.

(56) References Cited

U.S. PATENT DOCUMENTS

| | | | | |
|---|---|---|---|---|
| 9,033,644 B2* | 5/2015 | Hudgens | ................. | B25J 18/00 414/744.5 |
| 2003/0113187 A1* | 6/2003 | Lei | ................... | H01L 21/67126 414/217 |
| 2005/0111956 A1* | 5/2005 | van der Meulen | ...... | B25J 9/042 414/744.2 |
| 2006/0285945 A1* | 12/2006 | Hofmeister | ....... | H01L 21/67161 414/217 |
| 2007/0264106 A1* | 11/2007 | van der Meulen | .... | B25J 9/0084 414/217 |
| 2007/0269297 A1* | 11/2007 | Meulen | ................. | B65G 25/02 414/222.01 |
| 2009/0110518 A1* | 4/2009 | Rice | ................. | H01L 21/67386 414/220 |
| 2009/0142163 A1* | 6/2009 | Genetti | ............. | H01L 21/67196 414/217 |
| 2012/0305196 A1* | 12/2012 | Mori | ................. | H01L 21/67167 156/362 |
| 2013/0071218 A1 | 3/2013 | Hosek et al. | .............. | 414/744.5 |
| 2013/0088092 A1 | 4/2013 | Ladron de Guevara et al. | .......... | 307/109 |
| 2013/0272823 A1* | 10/2013 | Hudgens | ........... | H01L 21/67742 414/217 |
| 2013/0309047 A1* | 11/2013 | Wakabayashi | .... | H01L 21/67126 414/217 |
| 2013/0343841 A1* | 12/2013 | van der Meulen | ... | H01L 21/677 414/217 |
| 2014/0205416 A1 | 7/2014 | Hosek et al. | .............. | 414/744.5 |
| 2014/0271083 A1* | 9/2014 | Caveney | ........... | H01L 21/67173 414/749.5 |
| 2014/0301818 A1* | 10/2014 | Gilchrist | ........... | H01L 21/67742 414/744.2 |
| 2015/0139770 A1* | 5/2015 | Moura | ................. | B25J 11/0095 414/744.6 |
| 2015/0206782 A1* | 7/2015 | Caveney | ............. | B25J 11/0095 414/744.6 |

* cited by examiner

REDUCED FOOTPRINT SUBSTRATE TRANSPORT VACUUM PLATFORM

CROSS REFERENCE TO RELATED APPLICATIONS

This application claims priority under 35 USC 119(e) on Provisional Patent Application No. 61/864,028 filed Aug. 9, 2013 which is hereby incorporated by reference in its entirety.

BACKGROUND

Technical Field

The exemplary and non-limiting embodiments relate generally to a system for transporting substrates and, more particularly, to a system for transporting substrates, in vacuum, having a reduced footprint.

Brief Description of Prior Developments

Substrate processing systems for semiconductor, LED or other suitable applications may involve the transport of substrates in a vacuum or other suitable environment. In the applications requiring vacuum transport there is an platform architecture that involves the use of tandem or quad process modules. Tandem or quad process modules may have two processing locations where two substrates may be processed next to each other and picked or placed by a vacuum robot at the same time. The two modules may be integral or separate. A problem arises in the use of tandem or quad process modules where only one or two tandem or quad modules is provided. Here, a large transport chamber is required to transport the substrates to and from load locks and to and from the one or more modules requiring a large footprint or floor space. With foot print cost at a premium within a micro-electronics fabrication environment, there is a desire for a substrate transport platform for tandem or quad applications with a reduced footprint.

SUMMARY

In accordance with one aspect of the exemplary embodiment, an apparatus is provided. The apparatus has a vacuum transport chamber having first and second isolation valves coupled to first and second substrate processing locations. The vacuum transport chamber has third and fourth isolation valves coupled to first and second load locks respectively. A first substrate transport vacuum robot is provided having first and second substrate supporting end effectors, the first substrate transport vacuum robot located within the vacuum transport chamber between the first substrate processing location and the first load lock. A second substrate transport vacuum robot is provided having third and fourth substrate supporting end effectors, the second substrate transport vacuum robot located within the vacuum transport chamber between the second substrate processing location and the second load lock. The first substrate transport vacuum robot transports an unprocessed substrate from the first load lock to the first processing location and exchanges the unprocessed substrate for a processed substrate at the first processing location with the first and second end effectors substantially simultaneously as the second substrate transport vacuum robot transports a different unprocessed substrate from the second load lock to the second processing location and exchanges the different unprocessed substrate for a different processed substrate at the second processing location with the third and fourth end effectors.

In accordance with another aspect of the exemplary embodiment, an apparatus is provided. The apparatus has a vacuum transport chamber having first and second isolation valves coupled to first and second substrate processing locations. The vacuum transport chamber has third and fourth isolation valves coupled to a load lock. A first substrate transport vacuum robot is provided located within the vacuum transport chamber. A second substrate transport vacuum robot is provided located within the vacuum transport chamber. The load lock is located between the first and second substrate transport vacuum robots, the load lock having an atmospheric isolation valve. The atmospheric isolation valve, the third and the fourth isolation valves are arranged in a spaced triangular relationship. The first substrate transport vacuum robot transports a processed substrate from the first processing location to the load lock and transports an unprocessed substrate from the load lock to the first processing location substantially simultaneously as the second substrate transport vacuum robot transports a different processed substrate from the second processing location to the load lock and transports a different unprocessed substrate from the load lock to the second processing location.

In accordance with another aspect of the exemplary embodiment, an apparatus is provided. The apparatus has a vacuum transport chamber having first and second isolation valves coupled to first and second substrate processing locations. The vacuum transport chamber has third and fourth isolation valves coupled to a load lock. A first substrate transport vacuum robot is provided located within the vacuum transport chamber. A second substrate transport vacuum robot is provided located within the vacuum transport chamber. The load lock is located between the first and second substrate transport vacuum robots, the load lock having substrate supporting shelves and a moveable poppet sealed to a bottom face of the vacuum transport chamber. The first substrate transport vacuum robot transports a processed substrate from the first processing location to the load lock and transports an unprocessed substrate from the load lock to the first processing location substantially simultaneously as the second substrate transport vacuum robot transports a different processed substrate from the second processing location to the load lock and transports a different unprocessed substrate from the load lock to the second processing location.

BRIEF DESCRIPTION OF THE DRAWINGS

The foregoing aspects and other features are explained in the following description, taken in connection with the accompanying drawings, wherein.

DETAILED DESCRIPTION OF EMBODIMENTS

Figure 1:
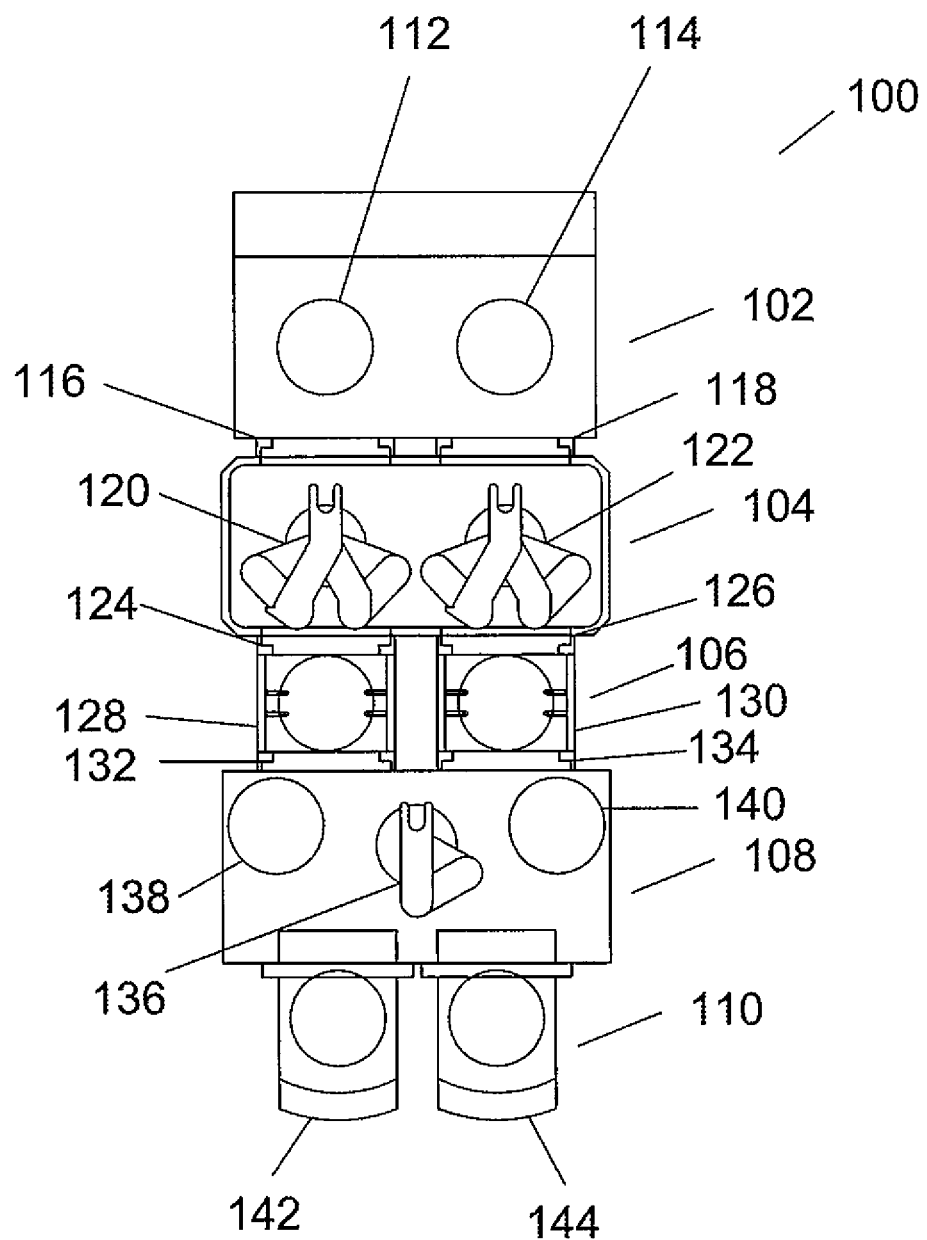
FIG. 1 is a top view of an example substrate transport platform.

Referring to FIG. 1, there is shown a schematic top plan view of an example substrate transport platform 100. Although the present embodiment will be described with reference to the embodiments shown in the drawings, it should be understood that the present invention may be embodied in many forms of alternative embodiments. In addition, any suitable size, shape or type of materials or elements could be used.

Figure 2:
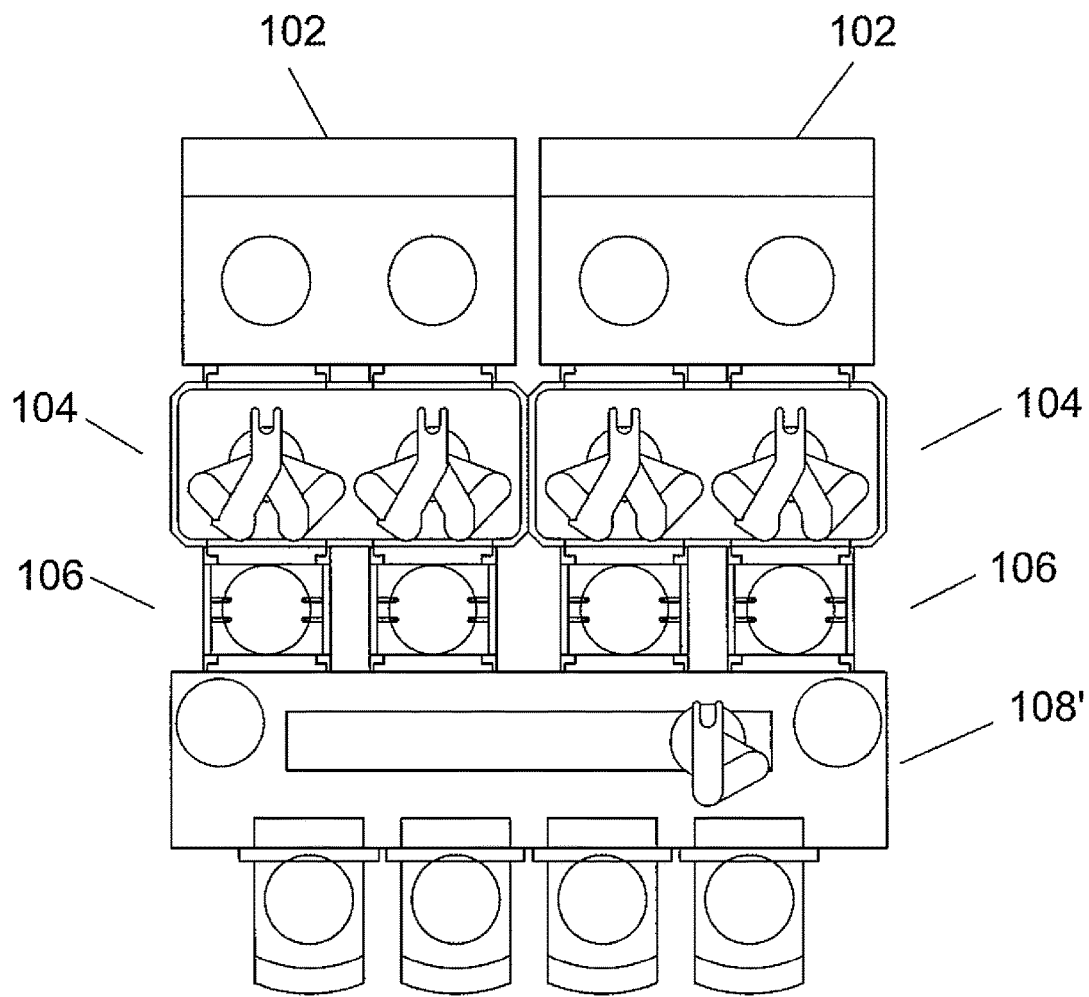
FIG. 2 is a top view of an example substrate transport platform.

Platform 100 has process module 102, vacuum transport system 104, load locks 106, Equipment Front End Module (EFEM) 108 and load ports 110. Vacuum robots 120, 122 may be provided within the vacuum chamber of platform 104 and may have features as disclosed in U.S. Patent application having Ser. No. 13/618,067 entitled "Robot Drive with Passive Rotor" and filed Sep. 14, 2012. Further, vacuum robots 120, 122 may be provided within the vacuum chamber of platform 104 and may have features as disclosed in U.S. Patent application having Ser. No. 13/618,117 entitled "Low Variability Robot" and filed Sep. 14, 2012 which is hereby incorporated by reference in its entirety. Further, vacuum robots 120, 122 may be provided within the vacuum chamber of platform 104 and may have features as disclosed in U.S. Patent application having Ser. No. 13/833, 732 entitled "Robot Having Arm With Unequal Link Lengths" and filed Mar. 15, 2013 which is hereby incorporated by reference in its entirety. Further, vacuum robots 120, 122 may be provided within the vacuum chamber of platform 104 and may have features as disclosed in U.S. Patent applications having Ser. No. 61/831,320 entitled "Robot and Adaptive Placement System and Method" and filed Jun. 5, 2013 which is hereby incorporated by reference in its entirety. All of the above referenced applications are hereby incorporated by reference in their entirety. Process module 102 may have process locations 112, 114 and may be used for any suitable semiconductor manufacturing process, for example, CVD, etch ashing or any suitable process. Valves 116, 118 isolate vacuum transport module 104 from process module 102. Vacuum robots 120, 122 transport wafers from load locks 106 to and from process module 102. Robots 120, 122 have single or double arms and may have unequal link lengths, equal link lengths or any suitable arm mechanism. Vacuum robots 120, 122 may cooperate with optical or any suitable sensors in transport module 104 to independently correct for offset wafer positions when placing substrates in module 102. Valves 124, 126 isolate load locks 128, 130 from vacuum transport module 104. Load locks 128, 130 may have one, two or any suitable number of shelves where the shelves may be stationary or may have an indexer. Valves 132, 134 isolate load locks 128, 130 from EFEM module 108. EFEM 108 may have alignment or buffer modules 138, 140 and has robot 136 to transport wafers from locks 106 to load ports 142, 144. Referring also to FIG. 2 there is shown a system with two process modules 102, transport modules 104, and load lock modules 106. A single extended EFEM 108' services the four load locks and four load ports.

As seen in FIG. 1, apparatus 100 is shown with a vacuum transport chamber 104 having first and second isolation valves 116, 118 coupled to first and second substrate processing locations 112, 114. Vacuum transport chamber 104 further has third and fourth isolation valves 124, 126 coupled to first and second load locks 128, 130 respectively. A first substrate transport vacuum robot 120 is shown having first and second substrate supporting end effectors, the first substrate transport vacuum robot 120 located within the vacuum transport chamber 104 between the first substrate processing location 112 and the first load lock 128. A second substrate transport vacuum robot 122 is shown having third and fourth substrate supporting end effectors, the second substrate transport vacuum robot 122 located within the vacuum transport chamber 104 between the second substrate processing location 114 and the second load lock 130. The first substrate transport vacuum robot 120 transports an unprocessed substrate from the first load lock 128 to the first processing location 112 and exchanges the unprocessed substrate for a processed substrate at the first processing location 112 with the first and second end effectors substantially simultaneously as the second substrate transport vacuum robot 122 transports a different unprocessed substrate from the second load lock 130 to the second processing location 114 and exchanges the different unprocessed substrate for a different processed substrate at the second processing location 114 with the third and fourth end effectors. In one aspect, the first substrate transport vacuum robot 120 has first and second articulated arms coupled to the first and second end effectors respectively where the first and second articulated arms each have a forearm and upper arm with the forearm having a link length different than that of the upper arm. In another aspect, the first load lock 128 has more than one substrate supporting shelf. In another aspect, the first substrate transport vacuum robot 120 is located within the vacuum transport chamber 104 in line with the first substrate processing location 112 and the first load lock 128 where the second substrate transport vacuum robot 122 is located within the vacuum transport chamber 104 in line with the second substrate processing location 114 and the second load lock 130.

Figure 3:
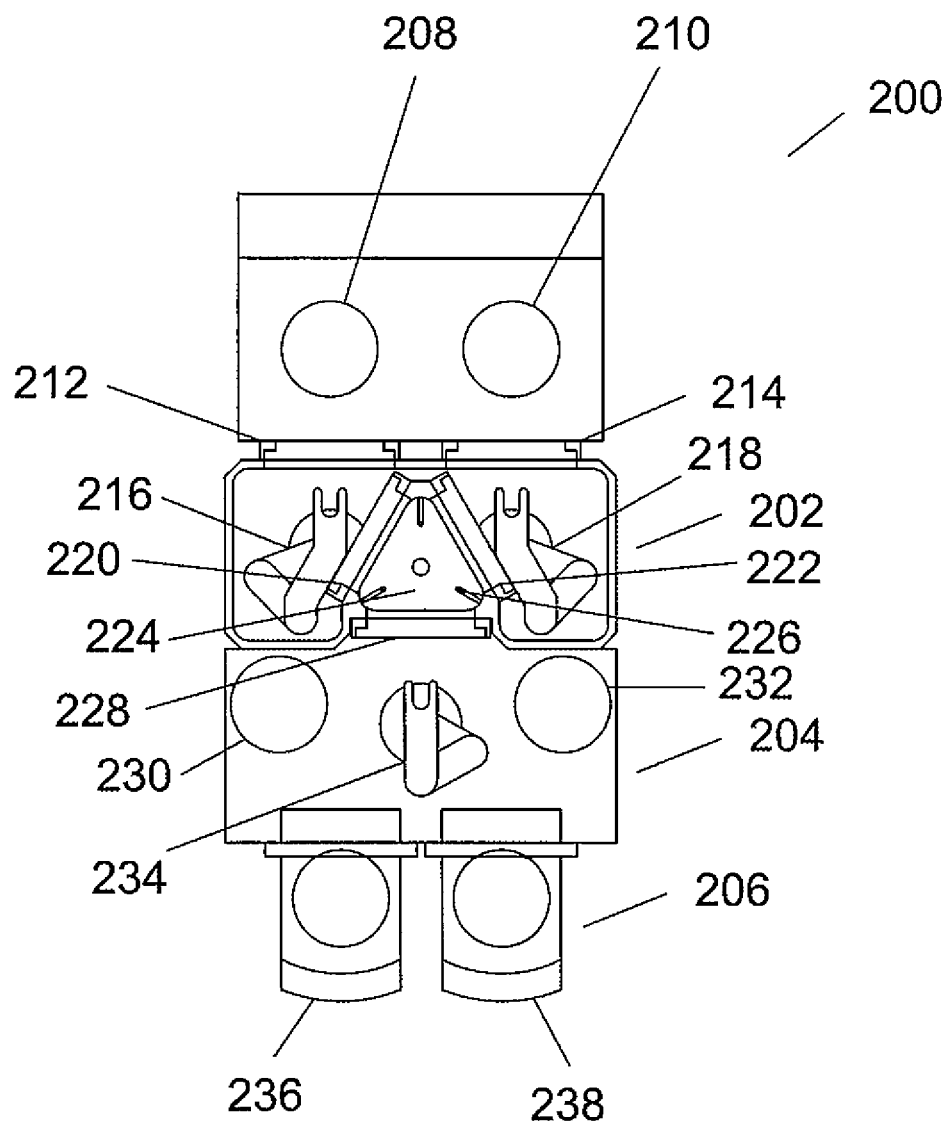
FIG. 3 is a top view of an example substrate transport platform.
Figure 4:
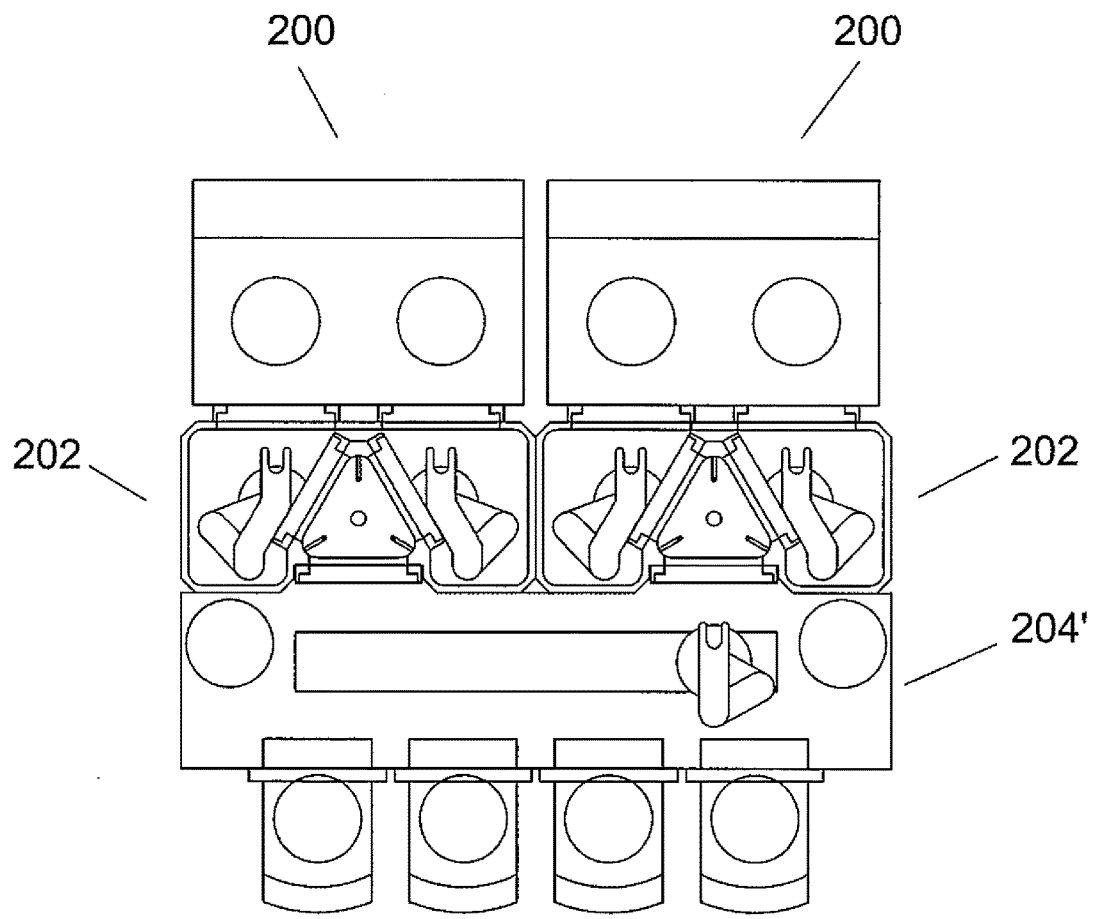
FIG. 4 is a top view of an example substrate transport platform.

Referring now to FIG. 3, there is shown a top view of platform 200. Platform 200 has process modules 208, 210, vacuum transport system 202, load lock 224, EFEM 204 and load ports 206. Vacuum robots 216, 281 may be provided within the vacuum chamber of transport system 202. The process module may have process locations 208, 210 and may be used for any suitable semiconductor manufacturing process, for example, CVD, etch ashing or any suitable process. Valves 212, 214 isolate vacuum transport module 202 from the process module. Vacuum robots 216, 218 transport wafers from load lock 224 to and from process modules 208, 210. Robots 216, 218 may have single or double arms and may have unequal link lengths, equal link lengths or any suitable arm mechanism. In an alternate embodiment, two additional inverted robots may be provided, for example, coaxial with robots 216, 218. In the embodiment shown, robots 216, 218 have unequal link lengths such that they accommodate load lock 224 being located between them thus substantially eliminating the footprint associated with load locks located between the vacuum transport platform and EFEM as seen in FIG. 1. Here, load lock 224 is located between robots 216, 218. Vacuum robots 216, 218 may cooperate with optical or any suitable sensors in transport module 202 to independently correct for offset wafer positions when placing substrates in module 102. Valves 220, 222 isolate load lock 224 from the vacuum transport region of vacuum transport module 202. Load lock 224 may have two, four or any suitable number of shelves where the shelves may be stationary or may have an indexer. Here, an indexer may be required where robots 216, 218 may have no z axis. Valve 228 isolates load lock 224 from EFEM module 204. EFEM 204 may have alignment or buffer modules 230, 232 and has robot 234 to transport wafers from lock 224 to load ports 236, 238. Referring also to FIG. 4 there is shown a system with two process modules 200, transport modules 202 with load lock module. A single extended EFEM 204' services the four load locks and four load ports.

As seen in FIG. 3, apparatus 200 is shown having a vacuum transport chamber 202 having first and second isolation valves 212, 214 coupled to first and second substrate processing locations 208, 210. The vacuum transport chamber 202 has third and fourth isolation valves 220, 222 coupled to load lock 224. First substrate transport vacuum robot 216 is shown located within the vacuum transport chamber 202. A second substrate transport vacuum robot 218 is shown located within the vacuum transport chamber 202. Load lock 224 is located between the first and second substrate transport vacuum robots 216, 218 with load lock 224 having an atmospheric isolation valve 228. The atmospheric isolation valve 228, the third 220 and the fourth 222 isolation valves are shown arranged in a spaced triangular relationship. The first substrate transport vacuum robot 216 transports a processed substrate from the first processing location 208 to the load lock 224 and transports an unprocessed substrate from the load lock 224 to the first processing location 208 substantially simultaneously as the second substrate transport vacuum robot 218 transports a different processed substrate from the second processing location 210 to the load lock 224 and transports a different unprocessed substrate from the load lock 224 to the second processing location 210. In one aspect, the load lock 224 is integrally formed with the vacuum transport chamber 202. In another aspect, the load lock 224 has 4 substrate supporting shelves. In another aspect, the load lock 224 and the vacuum transport chamber 202 are integrally formed with a substantially rectangular shape. In another aspect, the first substrate transport vacuum robot 216 has a first articulated arm having a forearm and a upper arm with the forearm having a link length different than that of the upper arm. In another aspect, the load lock 224 is located in line between the first and second substrate transport vacuum robots 216, 218. In another aspect, the first substrate transport vacuum robot 216 has a left handed articulated arm and the second substrate transport vacuum robot 218 has a right handed articulated arm. In another aspect, the first and second isolation valves 212, 214 and the atmospheric isolation valve 228 are arranged in a parallel relationship.

Figure 5:
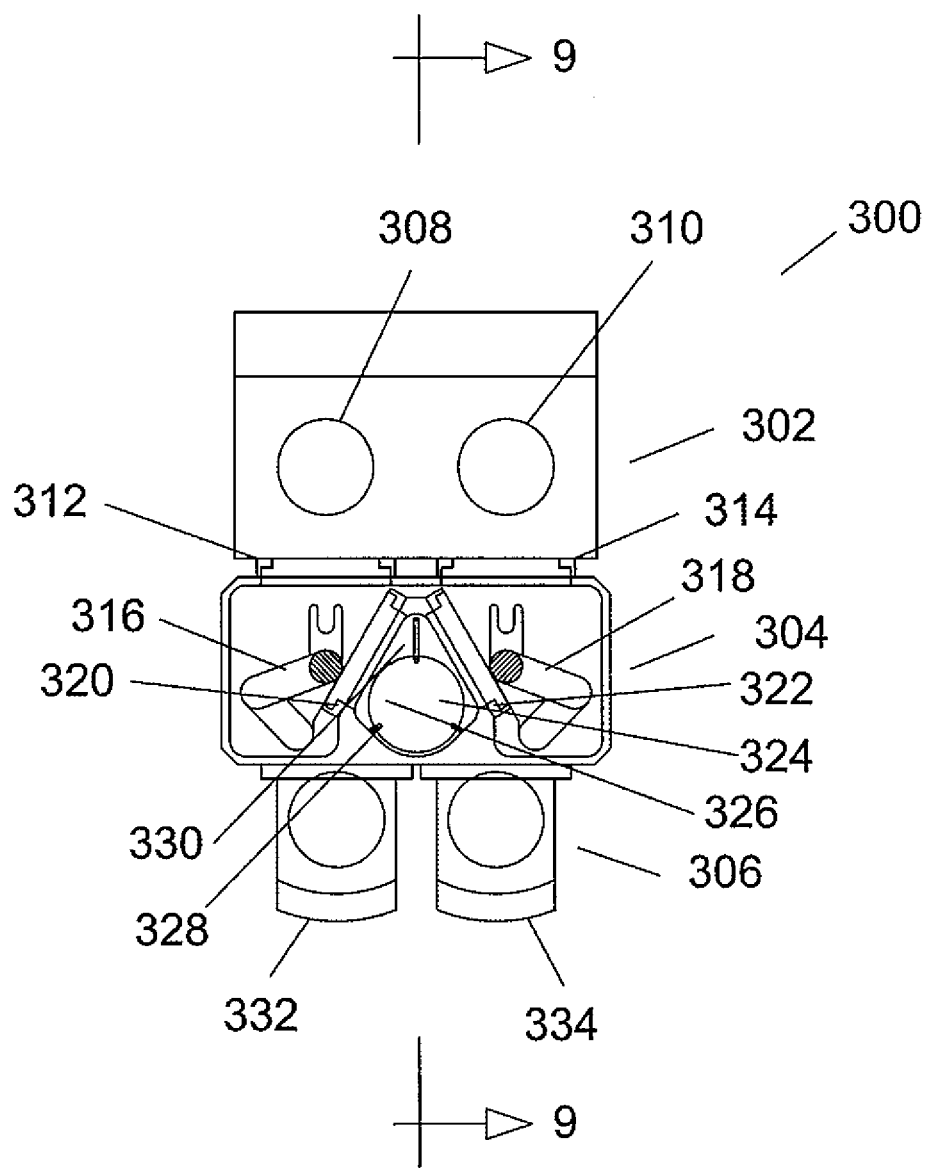
FIG. 5 is a top view of an example substrate transport platform.
Figure 6:
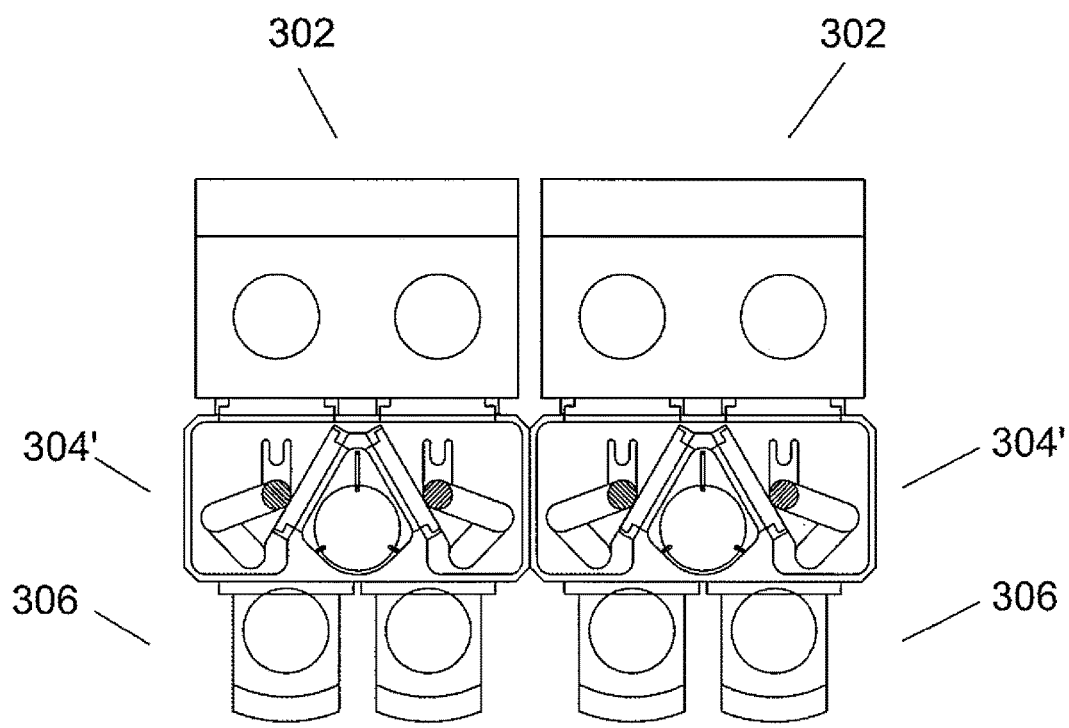
FIG. 6 is a top view of an example substrate transport platform.
Figure 7:
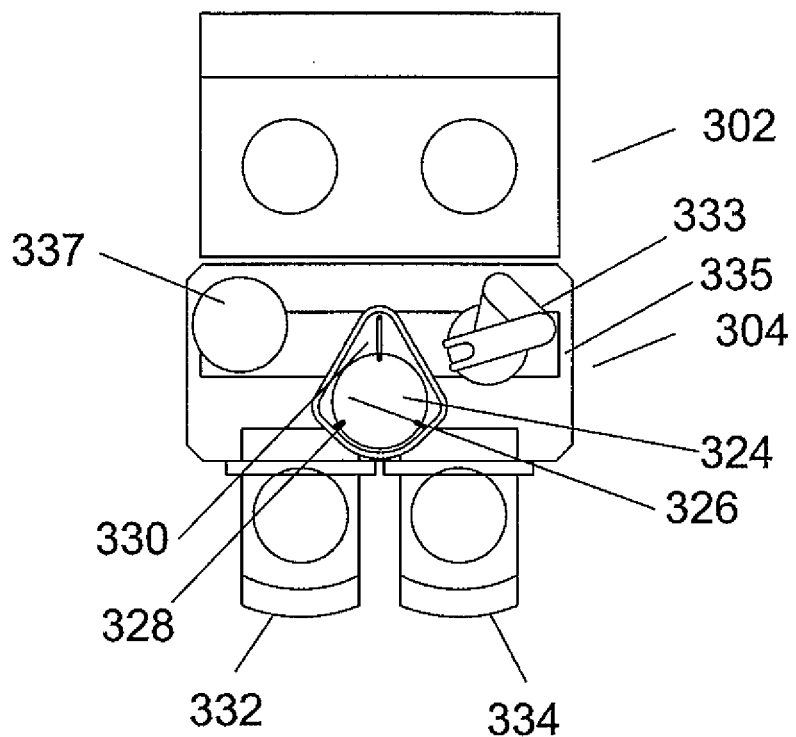
FIG. 7 is a top view of an example substrate transport platform.
Figure 8:
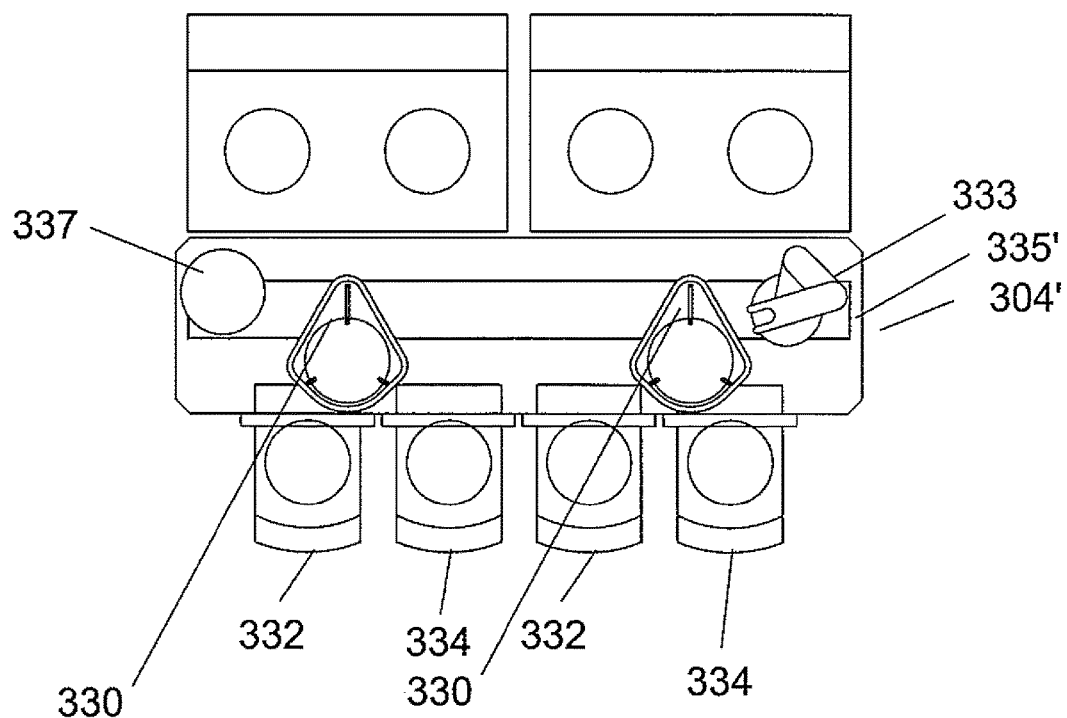
FIG. 8 is a top view of an example substrate transport platform.
Figure 9:
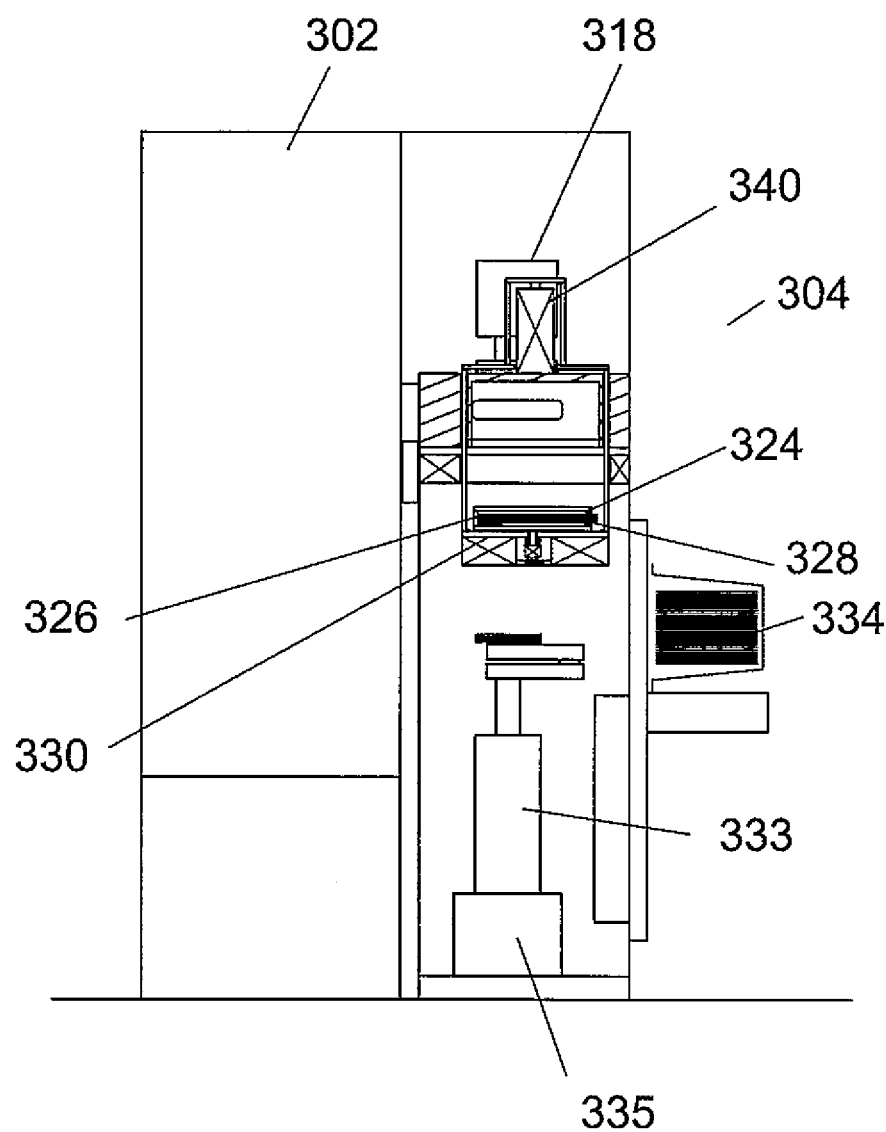
FIG. 9 is a section view of an example substrate transport platform.
Figure 10:
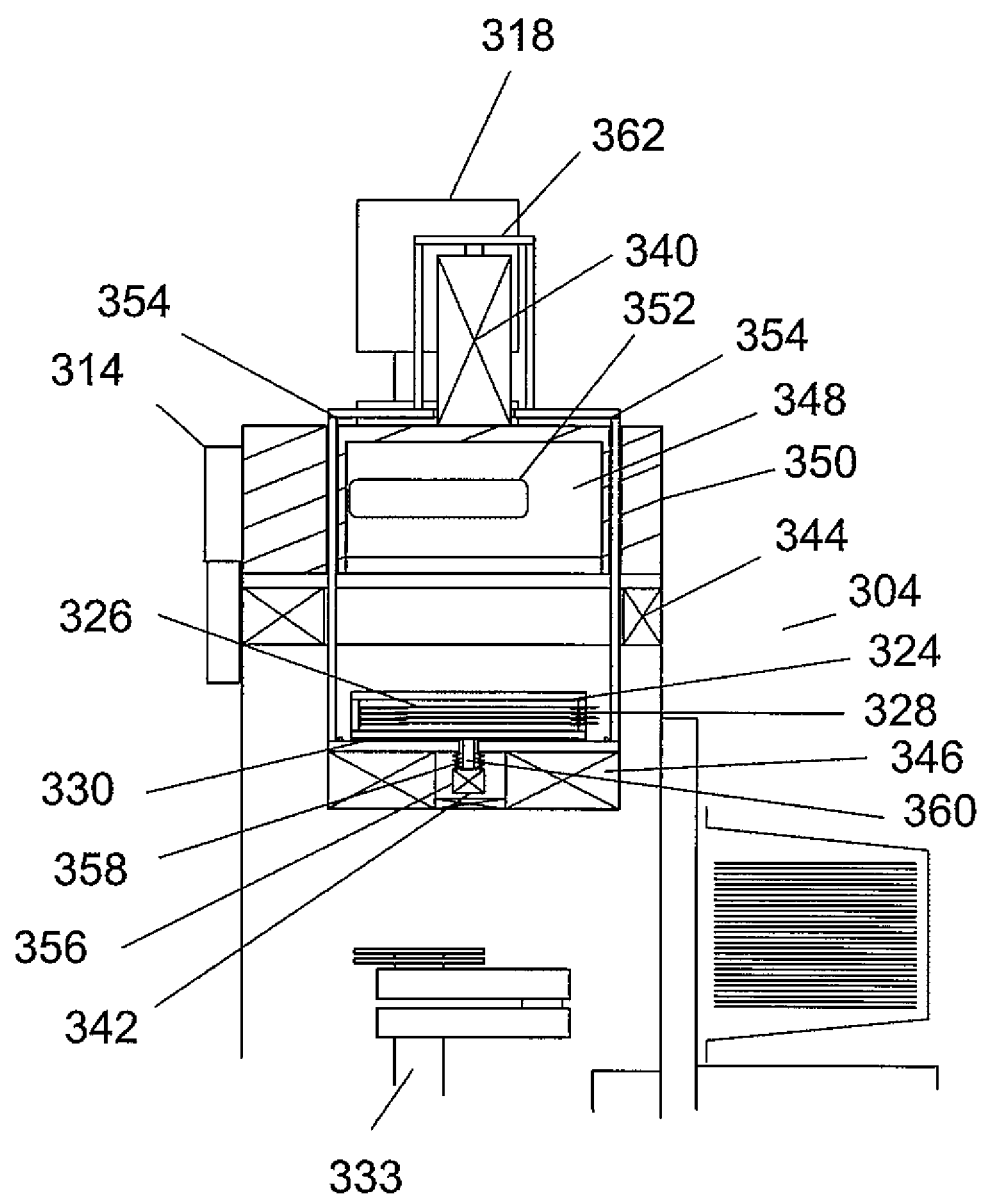
FIG. 10 is a section view of an example substrate transport platform.

Referring now to FIGS. 5 and 7, there is shown a top and section view of platform 300. Platform 300 has process module 302, combination vacuum transport system, load lock and EFEM 304 and load ports 306. Vacuum robots 316, 318 may be provided within the vacuum chamber of transport system 304. The process module may have process locations 308, 310 and may be used for any suitable semiconductor manufacturing process, for example, CVD, etch ashing or any suitable process. Valves 312, 314 isolate transport module 304 from the process module 302. Vacuum robots 316, 318 transport wafers from load lock 324 to and from process modules 308, 310. Robots 316, 318 may have single or double arms and may have unequal link lengths, equal link lengths or any suitable arm mechanism. In an alternate embodiment, two additional non inverted robots may be provided, for example, coaxial with robots 316, 318. In the embodiment shown, robots 316, 318 have unequal link lengths such that they accommodate load lock 324 being located between them thus substantially eliminating the footprint associated with load locks located between the vacuum transport platform and EFEM as seen in FIG. 1. Here, load lock 324 is located between robots 316, 318. Vacuum robots 316, 318 may cooperate with optical or any suitable sensors in transport module 304 to independently correct for offset wafer positions when placing substrates in module 302. Valves 320, 322 isolate load lock 324 from the vacuum transport region of vacuum transport module 304. Load lock 324 may have two, four or any suitable number of shelves where the shelves may be stationary or may have an indexer. Here, an indexer may be required where robots 316, 318 may have no z axis. Poppet 330 isolates load lock 324 from the atmospheric portion of module 304. The atmospheric portion of module 304 may have alignment or buffer modules 336 and has robot 332 and track 334 to transport wafers from lock 324 to load ports 332, 334. In the embodiment shown, the atmospheric region of transport module 304 resides below the vacuum transport region of module 304 as seen in FIG. 7. Referring also to FIGS. 9 and 10, there is shown a section view of tool 300. The section view shows the poppet 330 of load lock 324 in a lowered position where robot 332 may access wafers 326. In the raised position, the vacuum robots may access the wafers 326 when the lock is evacuated with poppet 330 sealing to the lower surface of chamber 350. Here, for example, robot 318 may access wafers through slot 352. Linear drive 340 lifts or lowers poppet 330 and is coupled to poppet 330 vial members 362, 354. Coupled to poppet 330 is vertical drive 342 to index wafers 326 on shelves 328. Vertical drive has bellows 360 isolating shaft 358 from vertical drive 356. Filters 344, 346 are provided to drive clean air in a vertical direction. During transport by robot 332, load lock 324 may vent nitrogen or clean air from the chamber portion to the atmospheric portion also. Referring also to FIGS. 6 and 8 there is shown a system with two process modules 302, transport modules 304' with load lock module and atmospheric transport. A single extended robot 332, 334' may service the four load locks and four load ports.

In operation, the system pumps and vents the load locks while unprocessed substrates are being processed in the process module. When the lock(s) are vented, the atmospheric robot may transport one or more processed wafers to the load ports and return unprocessed wafers to the load lock(s). When the locks are pumped, the vacuum robot may swap processed wafers from the process modules for unprocessed wafers in the load lock. In the exemplary embodiment, any suitable combination of features may be provided. For example, additional atmospheric robots may be provided. As another example, the vacuum transport may be located below the atmospheric transport. Accordingly all alternatives are contemplated.

As seen in FIG. 5, an apparatus is shown having a vacuum transport chamber of system 304 having first and second isolation valves 308, 310 coupled to first and second substrate processing locations 308, 310. The vacuum transport chamber has third and fourth isolation valves 320, 322 coupled to load lock 324. A first substrate transport vacuum robot 316 is located within the vacuum transport chamber. A second substrate transport vacuum robot 318 is located within the vacuum transport chamber. The load lock 324 is located between the first and second substrate transport vacuum robots 316, 318, the load lock 324 having substrate supporting shelves and a moveable poppet 330 sealed to a bottom face of the vacuum transport chamber. The first substrate transport vacuum robot 316 transports a processed substrate from the first processing location 308 to the load lock 324 and transports an unprocessed substrate from the load lock 324 to the first processing location 308 substantially simultaneously as the second substrate transport vacuum robot 318 transports a different processed substrate from the second processing location 310 to the load lock 324 and transports a different unprocessed substrate from the load lock 324 to the second processing location 310. In one aspect, the load lock 324 is integrally formed with the vacuum transport chamber. In another aspect, the load lock 324 has 4 substrate supporting shelves. In another aspect, the load lock 324 and the vacuum transport chamber are integrally formed with a substantially rectangular shape. In another aspect, the first substrate transport vacuum robot 316 has a first articulated arm having a forearm and a upper arm with the forearm having a link length different than that of the upper arm. In another aspect, the load lock is located 324 in line between the first and second substrate transport vacuum robots 316, 318. In another aspect, the first substrate transport vacuum robot 316 has a left handed articulated arm the second substrate transport vacuum robot 318 has a right handed articulated arm. In another aspect, the poppet 330 is vertically moveable and the substrate supporting shelves are vertically indexed below the bottom face of the vacuum transport chamber for the shelves to be accessible by an atmospheric transport robot.

An example embodiment may be provided in an apparatus comprising a vacuum transport chamber having first and second isolation valves coupled to first and second substrate processing locations; the vacuum transport chamber having third and fourth isolation valves coupled to first and second load locks respectively; a first substrate transport vacuum robot having first and second substrate supporting end effectors, the first substrate transport vacuum robot located within the vacuum transport chamber between the first substrate processing location and the first load lock; a second substrate transport vacuum robot having third and fourth substrate supporting end effectors, the second substrate transport vacuum robot located within the vacuum transport chamber between the second substrate processing location and the second load lock; wherein, the first substrate transport vacuum robot transports an unprocessed substrate from the first load lock to the first processing location and exchanges the unprocessed substrate for a processed substrate at the first processing location with the first and second end effectors substantially simultaneously as the second substrate transport vacuum robot transports a different unprocessed substrate from the second load lock to the second processing location and exchanges the different unprocessed substrate for a different processed substrate at the second processing location with the third and fourth end effectors.

The first substrate transport vacuum robot may have first and second articulated arms coupled to the first and second end effectors respectively and wherein the first and second articulated arms each have a forearm and upper arm with the forearm having a link length different than that of the upper arm. The first load lock may have more than one substrate supporting shelf. The first substrate transport vacuum robot may be located within the vacuum transport chamber in line with the first substrate processing location and the first load lock and wherein the second substrate transport vacuum robot is located within the vacuum transport chamber in line with the second substrate processing location and the second load lock.

An example embodiment may be provided in an apparatus comprising a vacuum transport chamber having first and second isolation valves coupled to first and second substrate processing locations; the vacuum transport chamber having third and fourth isolation valves coupled to a load lock; a first substrate transport vacuum robot located within the vacuum transport chamber; a second substrate transport vacuum robot located within the vacuum transport chamber; the load lock located between the first and second substrate transport vacuum robots, the load lock having an atmospheric isolation valve; the atmospheric isolation valve, the third and the fourth isolation valves arranged in a spaced triangular relationship; wherein, the first substrate transport vacuum robot transports a processed substrate from the first processing location to the load lock and transports an unprocessed substrate from the load lock to the first processing location substantially simultaneously as the second substrate transport vacuum robot transports a different processed substrate from the second processing location to the load lock and transports a different unprocessed substrate from the load lock to the second processing location.

The load lock may be integrally formed with the vacuum transport chamber. The load lock may have 4 substrate supporting shelves. The load lock and the vacuum transport chamber may be integrally formed with a substantially rectangular shape. The first substrate transport vacuum robot may have a first articulated arm having a forearm and a upper arm with the forearm having a link length different than that of the upper arm. The load lock may be located in line between the first and second substrate transport vacuum robots. The first substrate transport vacuum robot may have a left handed articulated arm and wherein the second substrate transport vacuum robot has a right handed articulated arm. The first and second isolation valves and the atmospheric isolation valve may be arranged in a parallel relationship.

An example embodiment may be provided in an apparatus comprising a vacuum transport chamber having first and second isolation valves coupled to first and second substrate processing locations; the vacuum transport chamber having third and fourth isolation valves coupled to a load lock; a first substrate transport vacuum robot located within the vacuum transport chamber; a second substrate transport vacuum robot located within the vacuum transport chamber; the load lock located between the first and second substrate transport vacuum robots, the load lock having substrate supporting shelves and a moveable poppet sealed to a bottom face of the vacuum transport chamber; wherein, the first substrate transport vacuum robot transports a processed substrate from the first processing location to the load lock and transports an unprocessed substrate from the load lock to the first processing location substantially simultaneously as the second substrate transport vacuum robot transports a different processed substrate from the second processing location to the load lock and transports a different unprocessed substrate from the load lock to the second processing location.

The load lock may be integrally formed with the vacuum transport chamber. The load lock may have 4 substrate supporting shelves. The load lock and the vacuum transport chamber may be integrally formed with a substantially rectangular shape. The first substrate transport vacuum robot may have a first articulated arm having a forearm and a upper arm with the forearm having a link length different than that of the upper arm. The load lock may be located in line between the first and second substrate transport vacuum robots. The first substrate transport vacuum robot may have a left handed articulated arm and wherein the second substrate transport vacuum robot may have a right handed articulated arm. The poppet may be vertically moveable and wherein the substrate supporting shelves are vertically indexed below the bottom face of the vacuum transport chamber for the shelves to be accessible by an atmospheric transport robot.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances.

What is claimed is:

1. An apparatus comprising:
a vacuum transport chamber having first and second isolation valves coupled to first and second substrate processing locations;
the vacuum transport chamber having third and fourth isolation valves coupled to first and second load locks respectively;
first and second buffer modules associated with the first and second load locks respectively;
a front end robot associated with each of the first and second buffer modules, the front end robot being configured to transport processed substrates and unprocessed substrates between the first and second buffer modules and the first and second load locks;
a first substrate transport vacuum robot having first and second substrate supporting end effectors, the first substrate transport vacuum robot located within the vacuum transport chamber between the first substrate processing location and the first load lock;
a second substrate transport vacuum robot having third and fourth substrate supporting end effectors, the second substrate transport vacuum robot located within the vacuum transport chamber between the second substrate processing location and the second load lock;
wherein, the first substrate transport vacuum robot is configured to transport an unprocessed substrate from the first load lock to the first processing location and is configured to exchange the unprocessed substrate for processed substrate at the first processing location with the first and second end effectors independent of and substantially simultaneously as the second substrate transport vacuum robot transports a different unprocessed substrate from the second load lock to the second processing location and is configured to exchange the different unprocessed substrate for a different processed substrate at the second processing location with the third and fourth end effectors.

2. The apparatus of claim 1 wherein the first substrate transport vacuum robot has first and second articulated arms coupled to the first and second end effectors respectively and wherein the first and second articulated arms each have a forearm and upper arm with the forearm having a link length different than that of the upper arm.

3. The apparatus of claim 1 wherein the first load lock has more than one substrate supporting shelf.

4. The apparatus of claim 1 wherein the first substrate transport vacuum robot is located within the vacuum transport chamber in line with the first substrate processing location and the first load lock and wherein the second substrate transport vacuum robot is located within the vacuum transport chamber in line with the second substrate processing location and the second load lock.

5. An apparatus comprising:
a vacuum transport chamber having first and second isolation valves coupled to first and second substrate processing locations;
the vacuum transport chamber having third and fourth isolation valves coupled to a load lock;
a first substrate transport vacuum robot located within the vacuum transport chamber;
a second substrate transport vacuum robot located within the vacuum transport chamber;
the load lock located between the first and second substrate transport vacuum robots, the load lock having an atmospheric isolation valve;
the atmospheric isolation valve, the third and the fourth isolation valves arranged in a spaced triangular relationship;
wherein, the first substrate transport vacuum robot is configured to transport a processed substrate from the first processing location to the load lock and is configured to transport an unprocessed substrate from the load lock to the first processing location substantially simultaneously as the second substrate transport vacuum robot transports a different processed substrate from the second processing location to the load lock and transports a different unprocessed substrate from the load lock to the second processing location.

6. The apparatus of claim 5 wherein the load lock is integrally formed with the vacuum transport chamber.

7. The apparatus of claim 5 wherein the load lock has 4 substrate supporting shelves.

8. The apparatus of claim 5 wherein the load lock and the vacuum transport chamber are integrally formed with a substantially rectangular shape.

9. The apparatus of claim 5 wherein the first substrate transport vacuum robot has a first articulated arm having a forearm and a upper arm with the forearm having a link length different than that of the upper arm.

10. The apparatus of claim 5 wherein the load lock is located in line between the first and second substrate transport vacuum robots.

11. The apparatus of claim 5 wherein the first substrate transport vacuum robot has a left handed articulated arm and wherein the second substrate transport vacuum robot has a right handed articulated arm.

12. The apparatus of claim 5 wherein the first and second isolation valves and the atmospheric isolation valve are arranged in a parallel relationship.

13. An apparatus comprising:
a vacuum transport chamber having first and second isolation valves coupled to first and second substrate processing locations;
the vacuum transport chamber having third and fourth isolation valves coupled to a load lock;
a first substrate transport vacuum robot located within the vacuum transport chamber;
a second substrate transport vacuum robot located within the vacuum transport chamber;
the load lock located between the first and second substrate transport vacuum robots, the load lock having substrate supporting shelves and a moveable poppet sealed to a bottom face of the vacuum transport chamber, the poppet being moveable to provide isolation of the load lock from an atmospheric portion of the apparatus;
wherein, the first substrate transport vacuum robot is configured to transport a processed substrate from the first processing location to the load lock and is configured to transport an unprocessed substrate from the load lock to the first processing location substantially simultaneously as the second substrate transport vacuum robot transports a different processed substrate from the second processing location to the load lock and transports a different unprocessed substrate from the load lock to the second processing location;

wherein the third and fourth isolation valves are arranged in a triangular configuration with the moveable poppet.

14. The apparatus of claim 13 wherein the load lock is integrally formed with the vacuum transport chamber.

15. The apparatus of claim 13 wherein the load lock has 4 substrate supporting shelves.

16. The apparatus of claim 13 wherein the load lock and the vacuum transport chamber are integrally formed with a substantially rectangular shape.

17. The apparatus of claim 13 wherein the first substrate transport vacuum robot has a first articulated arm having a forearm and a upper arm with the forearm having a link length different than that of the upper arm.

18. The apparatus of claim 13 wherein the load lock is located in line between the first and second substrate transport vacuum robots.

19. The apparatus of claim 13 wherein the first substrate transport vacuum robot has a left handed articulated arm and wherein the second substrate transport vacuum robot has a right handed articulated arm.

20. The apparatus of claim 13 wherein the poppet is vertically moveable and wherein the substrate supporting shelves are vertically indexed below the bottom face of the vacuum transport chamber for the shelves to be accessible by an atmospheric transport robot.

* * * * *

UNITED STATES PATENT AND TRADEMARK OFFICE
CERTIFICATE OF CORRECTION

PATENT NO.         : 10,328,580 B2
APPLICATION NO.    : 14/454926
DATED              : June 25, 2019
INVENTOR(S)        : Christopher Hofmeister and Martin Hosek Page 1 of 1

It is certified that error appears in the above-identified patent and that said Letters Patent is hereby corrected as shown below:

In the Claims

In Claim 1:
Column 9, Line 44, "processed" should be deleted and --a processed-- should be inserted.

Signed and Sealed this
Twenty-seventh Day of August, 2019

Andrei Iancu
*Director of the United States Patent and Trademark Office*